(12) United States Patent
Tang et al.

(10) Patent No.: US 12,507,510 B2
(45) Date of Patent: Dec. 23, 2025

(54) DISPLAY PANEL AND DISPLAY DEVICE WITH IMPROVED LIGHT COLLECTION FOR PHOTOSENSITIVE FUNCTIONAL ELEMENT

(71) Applicant: Shanghai Tianma Micro-electronics Co., Ltd., Shanghai (CN)

(72) Inventors: Shihao Tang, Shanghai (CN); Yang Zeng, Shanghai (CN); Yaodong Wu, Shanghai (CN); Jiaxian Liu, Shanghai (CN); Qijun Yao, Shanghai (CN); Feng Lu, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 512 days.

(21) Appl. No.: 17/377,119

(22) Filed: Jul. 15, 2021

(65) Prior Publication Data

US 2022/0344544 A1 Oct. 27, 2022

(30) Foreign Application Priority Data

Apr. 23, 2021 (CN) .......................... 202110463391.0

(51) Int. Cl.
*H10H 20/84* (2025.01)
*H10H 20/857* (2025.01)
*H10H 29/14* (2025.01)

(52) U.S. Cl.
CPC .......... *H10H 20/84* (2025.01); *H10H 20/857* (2025.01); *H10H 29/142* (2025.01)

(58) Field of Classification Search
CPC ....... H01L 33/44; H01L 27/156; H01L 33/62; H01L 25/167
See application file for complete search history.

(56) References Cited

U.S. PATENT DOCUMENTS

| | | | | |
|---|---|---|---|---|
| 2009/0207100 | A1* | 8/2009 | Fukuchi | G02F 1/133514 345/32 |
| 2010/0033646 | A1* | 2/2010 | Baek | G02F 1/136209 438/30 |
| 2011/0180798 | A1* | 7/2011 | Shim | G02F 1/133514 257/E33.053 |
| 2015/0362795 | A1* | 12/2015 | Chen | G02F 1/133512 257/40 |

(Continued)

FOREIGN PATENT DOCUMENTS

| CN | 110174794 A | 8/2019 |
|---|---|---|
| CN | 111312792 A | 6/2020 |

*Primary Examiner* — Norman D Richards
*Assistant Examiner* — Sean Ayers Winters
(74) *Attorney, Agent, or Firm* — Anova Law Group, PLLC

(57) ABSTRACT

A display panel and a display device are provided. The display panel includes a substrate; a light-emitting unit disposed on one side of the substrate; and a light-shielding layer disposed a side of the light-emitting unit away from the substrate. The light-shielding layer includes a first type of openings and a second type of openings; each of the first type of openings includes a first holding area and a second holding area corresponding the first holding area; first holding areas and the second type of openings are configured to dispose first color resists; the second holding area is configured to dispose a filling color resist; and an opening area of the first holding area is smaller than an opening area of each of the second type of openings.

20 Claims, 8 Drawing Sheets

(56) References Cited

U.S. PATENT DOCUMENTS

2018/0165496 A1* 6/2018 Cheng ................. G09F 9/00
2019/0013363 A1* 1/2019 Joo ................. H10K 59/121
2020/0258946 A1* 8/2020 Kim ................. H10K 50/115

* cited by examiner

DISPLAY PANEL AND DISPLAY DEVICE WITH IMPROVED LIGHT COLLECTION FOR PHOTOSENSITIVE FUNCTIONAL ELEMENT

CROSS-REFERENCE TO RELATED APPLICATION

This application claims the priority of Chinese Patent Application No. 202110463391.0, filed on Apr. 23, 2021, the content of which is incorporated by reference in its entirety.

TECHNICAL FIELD

The present disclosure generally relates to the field of display technology and, more particularly, relates to a display panel and a display device.

BACKGROUND

In display industry, high demanding for the display effect of display devices are continuously increased. In one aspect, how to achieve a true "full screen" display has become the direction of research and development efforts.

At present, one solution includes forming holes in at least two functional layers of the display area of the display panel based on the principle of the pinhole imaging to provide a working light path for a photosensitive functional element (such as a camera and an infrared sensor), and to meet the operational requirements of the photosensitive functional element. On the basis of this, the normal display function at the location of the photosensitive functional element is ensured, thereby increasing the screen-to-body ratio of the display panel.

However, the small holes in this solution will be visible under certain use conditions, which will bring a bad use experience to the user. The disclosed display panels and display devices are directed to solve one or more problems set forth above and other problems in the art.

SUMMARY

One aspect of the present disclosure provides a display panel. The display panel may include a substrate; a light-emitting unit disposed on one side of the substrate; and a light-shielding layer disposed on a side of the light-emitting unit away from the substrate. The light-shielding layer includes a first type of openings and a second type of openings; each of the first type of openings includes a first holding area and a second holding area corresponding the first holding area; first holding areas and the second type of openings are configured to dispose first color resists; the second holding area is configured to dispose a filling color resist; and an opening area of the first holding area is smaller than an opening area of each of the second type of openings.

Another aspect of the present disclosure provides a display device. The display device may include a preset functional device; and a display panel. The display panel may include a substrate; a light-emitting unit disposed on one side of the substrate; and a light-shielding layer disposed on a side of the light-emitting unit away from the substrate. The light-shielding layer includes a first type of openings and a second type of openings; each of the first type of openings includes a first holding area and a second holding area corresponding the first holding area; first holding areas and the second type of the openings are configured to dispose first color resists; second holding areas are configured to dispose filling color resists; and an opening area of the first holding area is smaller than an opening area of one of the second type of openings.

Other aspects of the present disclosure can be understood by those skilled in the art in light of the description, the claims, and the drawings of the present disclosure.

BRIEF DESCRIPTION OF THE DRAWINGS

To more clearly illustrate the technical solutions in the embodiments of the present disclosure or the prior art, the following will briefly introduce the drawings needed in the description of the embodiments or prior art. Obviously, the drawings in the following description are only exemplary embodiment of the present disclosure. For those of ordinary skill in the art, other drawings can be obtained according to the provided drawings without creative work.

DETAILED DESCRIPTION

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in this disclosure, all other embodiments obtained by those of ordinary skill in the art without creative work shall fall within the protection scope of this disclosure.

Figure 1:
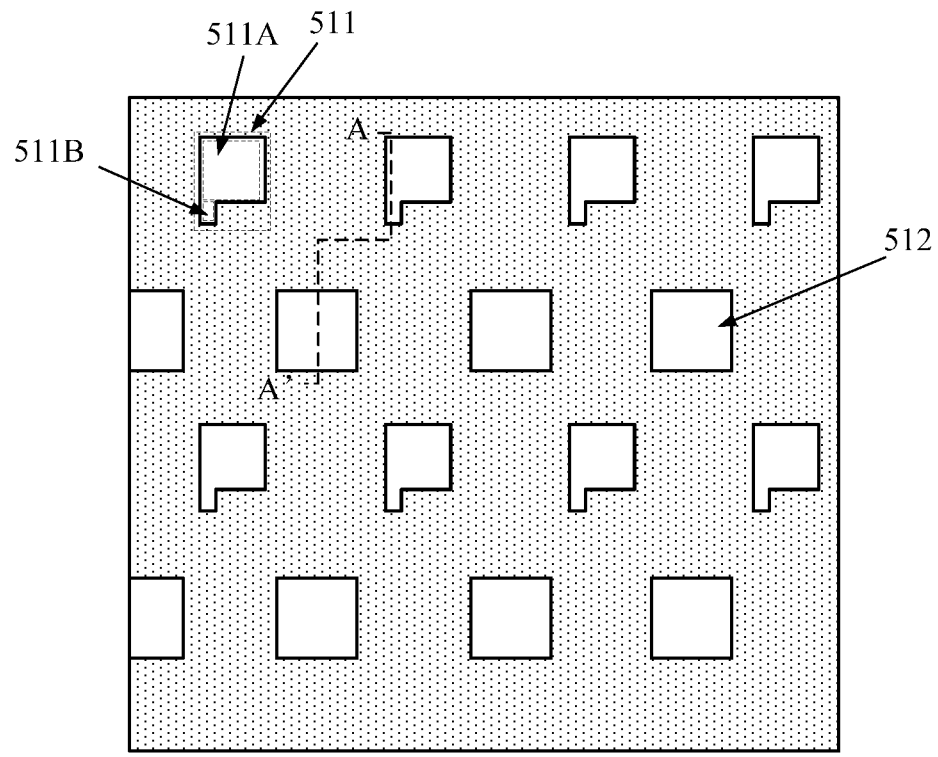
FIG. 1 illustrates a top view of an exemplary display panel according to various disclosed embodiments of the present disclosure.
Figure 2:
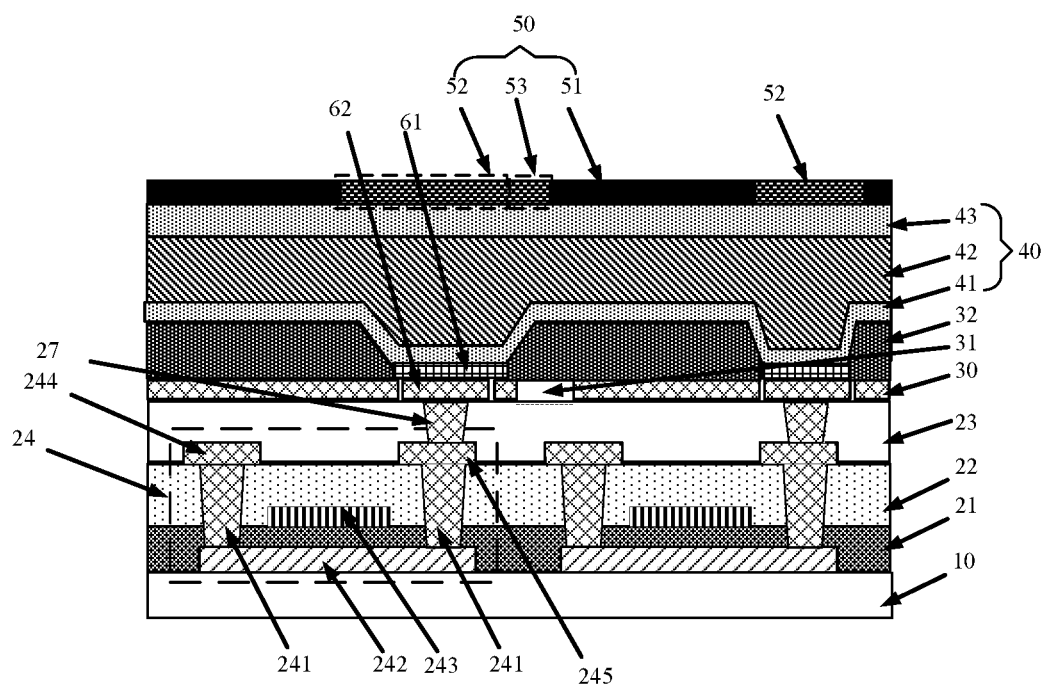
FIG. 2 illustrates an AA-sectional-view of FIG. 1.

The present disclosure provides a display panel. FIGS. 1-2 illustrate an exemplary display panel consistent with various disclosed embodiments of the present disclosure. FIG. 1 is a schematic partial top view structure of the display panel, and FIG. 2 is an AA-sectional view of FIG. 1.

As shown in FIGS. 1-2, the display panel may include a substrate 10 and a light-emitting unit 61 located on one side of the substrate 10. The display panel may also include a light-shielding layer 51 disposed over the side of the light-emitting unit 61 away from the substrate 10.

The light-shielding layer 51 may include a first type of openings 511 and a second type of openings 512. Each of the first type of openings 511 may include a first holding area 511A and a second holding area 511B corresponding to the first holding area 511A. The first holding areas 511A and the second type of openings 512 may be used to dispose first color resists 52, and the second holding areas 511B may be used to dispose filling color resists 53. The opening area of the first holding area 511A may be smaller than the opening area of the second type of opening 512.

In one embodiment, the light-shielding layer 51 may include a black matrix layer. The first color resist 52, the filling color resist 53 and the light-shielding layer 51 together may constitute a color film layer 50.

Referring to FIG. 2, in addition to the above structures, other possible stacked film layers of the display panel may include thin-film transistors 24, a signal line layer 30, an encapsulation layer 40, pixel electrodes 62, and multiple insulating layers, etc.

The thin-film transistor 24 may include an active layer 242, a gate electrode layer 243, a source electrode layer 244, and a drain electrode layer 245. The source electrode layer 244 and the drain electrode layer 245 may be connected to the source/drain regions of the active layer 242 through two source and drain vias 241, respectively. The drain electrode layer 245 may be electrically connected to the pixel electrode 62 through an electrode via 27.

The signal line layer 30 may be formed in a same layer as the pixel electrode 62 by a patterning process of a same metal layer. The signal line layer 30 may include signal line openings 31. In one embodiment, the orthographic projection of the signal opening 31 on the substrate 10 may at least partially overlap the orthographic projection of the second holding area 511B on the substrate 10. The signal line opening 31 may cooperate with the second holding area 511B to form a light path to meet the requirements of the preset functional element for the working light.

In one embodiment, the orthographic projection of the signal line opening 31 on the substrate 10 may be located within the orthographic projection of the second holding area 511B on the substrate 10, and the area of the orthographic projection of the signal line opening 31 on the substrate 10 may be less than or equal to the area of the orthographic projection of the second holding area 511B on the substrate 10. The signal line opening 31 may cooperate with the second holding area 511B to form a light path to improve the collection of light by the preset functional element and improves the working sensitivity of the preset functional element.

In some embodiments of the present disclosure, the signal line layer 30 may also be on a same layer as the source electrode layer 245 or the gate electrode layer 243 of the thin-film transistor 24. The structure is not limited in the present disclosure and depends on the specific structure and the actual situation.

The encapsulation layer 40 may include a first encapsulation layer 41, a second encapsulation layer 42, and a third encapsulation layer 43. Both the first encapsulation layer 41 and the third encapsulation layer 43 may be inorganic film layers, and the second encapsulation layer 42 may be an organic layer formed by ink jet printing.

The plurality of insulating layers between the above structures may include an interlayer insulating layer 21, a gate insulating layer 22, a planarization layer 23, and a pixel definition layer 32, etc.

As mentioned above, in the display panel provided by the embodiment of the present disclosure, based on the principle of the pinhole imaging, the second holding area 511B may cooperate with the signal line opening 31 to form a light path. The second holding areas 511B arranged as an array and the signal line openings 3 may form the matrix pinhole imaging system (MAPIS).

Taking the preset functional element as the fingerprint identification element as an example, the fingerprint identification element may need to receive the feedback light that irradiates on the user's finger and carries the fingerprint information to form an image according to the feedback light to the obtain the fingerprint information. The feedback light may only travel through the light path formed by the second holding area 511B and the signal line opening 31 to reach the surface of the fingerprint identification element to satisfy the requirements of the fingerprint identification for the light collection to improve the working sensitivity of the fingerprint identification component.

However, if the opening area of the first holding area 511A is same as the opening area of the second type of opening 512, because of the existence of the second holding area 511B, the opening area of the first type of opening 511 and the opening area of the second type of opening 512 may have a large difference, which may make the first type of opening 511 pass more external light than the second type of opening 512 when the display panel is at the non-display state (i.e., the black screen state). Further, when irradiated by the external light, such as sunlight, the external light transmitted by the first type of opening 512 may be greater than the external light transmitted by the second type of opening 512. Correspondingly, the external light reflected from the first type of opening 511 may be more than the external light reflected from the second type of opening 512. Such a condition may cause an obvious visual difference between the first type of opening 511 and the second type of opening 512, and the user experience may be unacceptable.

Figure 3:
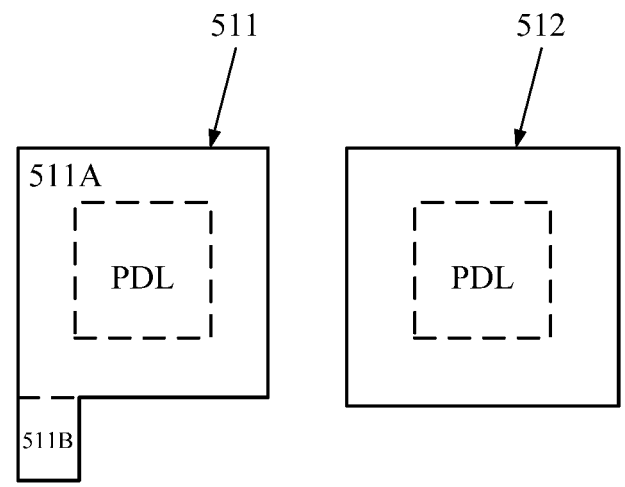
FIG. 3 illustrates an exemplary comparison between a first type opening and a second type of opening according to various disclosed embodiments of the present disclosure.

FIG. 3 shows a comparative schematic diagram of the first type of opening 511 and the second type of opening 512. As shown in FIG. 3, the area of the first holding area 511A of the first type of opening 511 may be larger than the opening area of the second type of opening 512. Further, the first type of opening 511 may also include the second holding area 511B. Therefore, the difference between the opening size of the first type of opening 511 and the second type of opening 512 may be substantially small. Thus, the issue that the first type of opening 511 may be visible caused by the difference in size of the two types of openings being exposed to sunlight may be relieved.

Further, FIG. 3 also shows the relative positional relationship between the opening PDL of the pixel definition layer 23 and the first type of opening 511 and the second type of opening 512. As shown FIG. 3, in general, the size of the opening PDL of the pixel definition layer 23 for setting the light-emitting unit 61 of the same color may remain unchanged. Therefore, because the opening area of the first holding area 511A may be relatively small, the distance between the opening boundary of the first holding area 511A and the boundary of the opening PDL may be relatively close.

Generally, the opening area of the second type of opening 512 may be between approximately 25 μm×15 μm and 25 μm×20 μm, and the opening area of the second holding area 511B may be approximately 10 μm×10 μm. The opening area of the first holding area 511A may be larger than the opening area of the second holding area 511B, but smaller than the opening area of the second type of opening 512. From a functional point of view, the first holding area 511A and the second type of opening 512 may both be used to set the first color resist 52. The first color resist 52 corresponding to the light-emitting unit 61 may be configured to transmit light of a specific color emitted by the light-emitting unit 61, and the light may be used for the display of the display panel. In one embodiment, the first color resist 52 may include one of a red color resist, a green color resist, and a blue color resist.

The filling color resist 53 provided in the second holding area 511B may be used to cooperate with the signal line opening 31 of the signal line layer 30 to form a light path, and the light passing through the light path may be used to meet the working requirements of preset functional element. The opening area of the second holding area 511B may depend on the film layer design between the second holding area 511B and the signal line layer. In general, the opening area of the second holding area 511B may be proportional to the thickness of the film layer between the second holding area 511B and the signal line layer. For example, the smaller the thickness of the film layer, the smaller the opening area of the second holding area 511B.

In one embodiment, with regard to the types of the filling color resists 53, the filling color resists 53 may be color resists of a same color. The reason may be that, in general, the wavelength of the working light of the preset functional component may be concentrated in the wavelength range of a certain color light, the approach that the filling color resists 53 re set to be the color resistors of the same color may help to ensure that the light passing through the light path may all be the required light for the functions of the preset functional component.

Further, referring to FIG. 2, in one embodiment, in the first type of opening 511, the color of the filling color resist 53 may be same as the color of the first color resist 52 in the first holding area 511A. Such a configuration of the color of the filling resist 53 and the color of the first color resist 52 in the first holding area 511A may allow the filling color resist 53 and the first color resist 52 in the first holding area 511A to be form in a same process. Accordingly, the fabrication process of the filling color resist 53 may be simplified.

Similar to the first color resist 52, the filling color resist 53 may also be one of a red color resist, a green color resist and a blue color resist. In one embodiment of the present disclosure, the filling color resist includes a green color resist. Generally, the optimal working light wavelength range of most of the preset functional elements may also be within the wavelength range of the green light. For example, the preset functional element may have a strong light collection ability for green light, and the preset functional element may have a high sensitivity in the working state of the green light. Therefore, the filling color resist 53 may include the green color resist to improve the working sensitivity of the preset functional element. When the preset functional element includes a fingerprint recognition element, the sensitivity of the fingerprint recognition of the display panel may be improved.

In one embodiment, referring to FIG. 1 and FIG. 3, the shape of the orthographic projections of the first holding area 511A, the second holding area 511B, and the second type of opening 512 on the substrate may all include a rectangle. The rectangular shape of the first holding area 511A, the second holding area 511B and the second type of opening 512 may facilitate the opening layout design of the light-shielding layer 51 on the one hand, and on the other hand, it may facilitate to make the full use of the space of the display area of the display panel.

Figure 4:
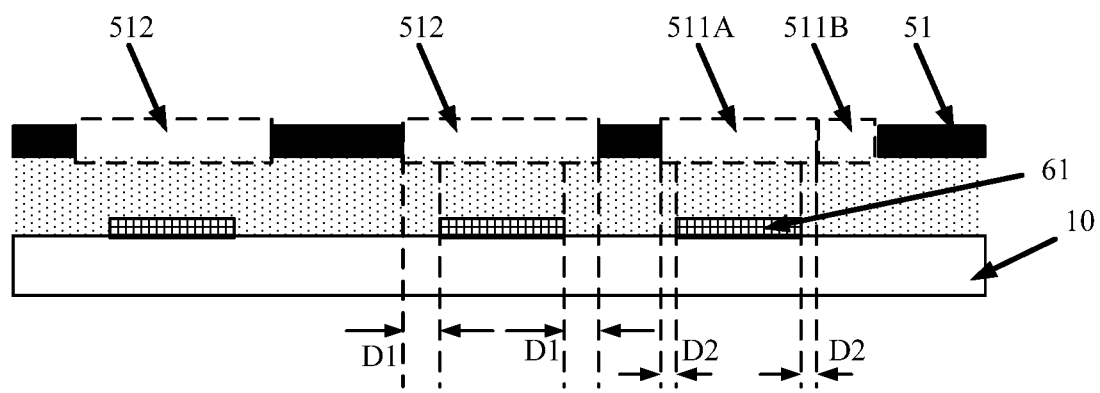
FIG. 4 illustrates a cross-sectional view of another exemplary display panel according to various disclosed embodiments of the present disclosure.

FIG. 4 is a schematic cross-sectional view of an exemplary display panel consistent with various disclosed embodiments of the present disclosure. As show in FIG. 4, the orthographic projection of the light-emitting unit 61 on the substrate 10 may be located in the second type of opening 512 corresponding to the light-emitting unit 61, or in the first holding area 511A corresponding to the light-emitting unit 61.

Referring to FIG. 4, a first projection distance D1 may be greater than a second projection distance D2. The first projection distance D1 may include the distance between a side of the orthographic projection of the light-emitting unit 61 on the substrate 10 and a side of the orthographic projection of the second type of opening 512 corresponding to the light-emitting unit 61 on the substrate 10. The second projection distance D2 may include the distance between the side of the orthographic projection of the light-emitting unit 61 on the substrate 10 and the side of the orthographic projection the first holding area 511A corresponding to the light-emitting unit 61 on the substrate 10.

In FIG. 4, to clearly show the relative positional relationship between the light-emitting unit 61 and the first holding area 511A and the second type of opening 512, only the substrate 10, the light-shielding layer 51 are shown. The two types of openings in the light-shielding layer 51 and the light-emitting unit 61 are illustrated; and other layers in the middle are omitted.

Because the opening sizes of the light-emitting units 61 for emitting light of different colors may be different, the size relationship between the first projection distance D1 and the second projection distance D2 may both refer to the light-emitting units 61 that emit light of a same color.

In one embodiment, by reducing the opening area of the first holding area 511A, the opening areas of the first type of openings 511 and the second type of openings 512 may be similar in size. Such a configuration may reduce the reflective visible issue under the sun light that caused by the significant difference between the opening area of the first type of opening 511 and the opening area of the second type of opening 512.

In one embodiment, the difference between the first projection distance D1 and the second projection distance D2 may be less than or equal to approximately 1 μm.

Limiting the difference between the first projection distance D1 and the second projection distance D2 to be approximately 1 μm or less may, under the basis of reducing size difference between the opening area of the first type of opening 511 and the second type of opening 512, avoid the low light output efficiency issue that caused by the excess shielding to the light emitted by the light-emitting unit 61 caused by the too small area of the corresponding first holding area 511A.

In one embodiment, referring to FIG. 3, the difference between the opening area of the first holding area 511A and the opening area of the second type of opening 512 may be less than or equal to the opening area of the second holding area 511B.

In one embodiment, ensuring that the difference between the opening area of the first holding area 511A and the opening area of the second type of opening 512 may not be greater than the opening area of the second holding area 511B may, on the basis of reducing the difference in the size of the opening area of the first type of opening 511 and the second type of opening 512, may avoid the low light-emitting efficiency issue caused by the excessive blocking of the too small size of the first holding area 511A to the corresponding light-emitting unit.

In one embodiment, referring to FIG. 1 or FIG. 3, the second holding area 511B may be connected with the first holding area 511A corresponding to the second holding area 511B.

Connecting the first holding area 511A with the second holding area 511B may reduce the preparation accuracy of the mask when preparing the first type of opening, and there may be no need to separately prepare the mask openings for the second holding area 511B.

Figure 5:
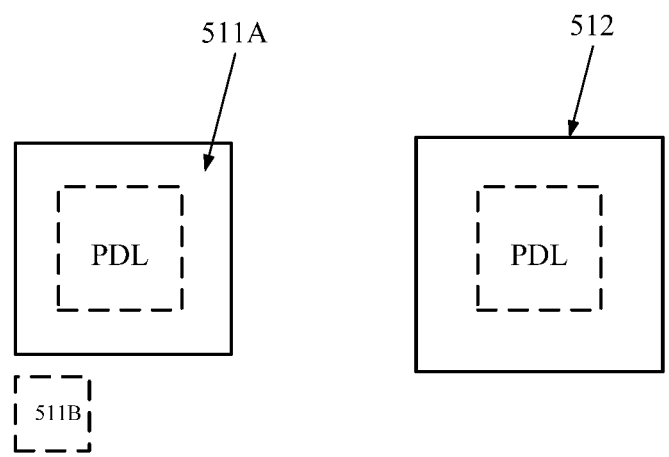
FIG. 5 illustrates another exemplary comparison between a first type of opening and a second type of opening according to various disclosed embodiments of the present disclosure.

FIG. 5 is an enlarged schematic view of the first type of opening. As shown in FIG. 5, the second holding area 511B and the first holding area 511A may not be connected. Whether the second holding area 511B and the first holding area 511A are connected may be set according to the actual layout requirements of the color resist and working parameters of the preset functional element, which is not limited in this disclosure.

Figure 6:
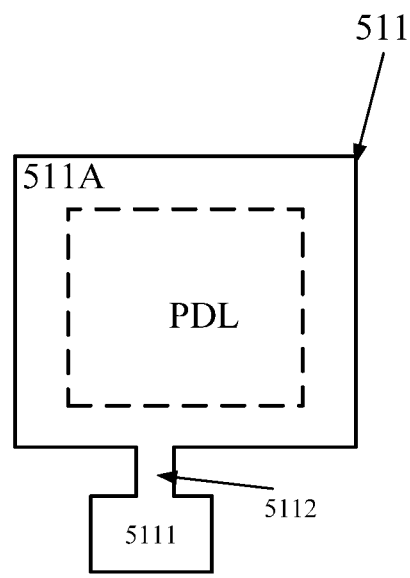
FIG. 6 illustrates a zoomed-in view of an exemplary first type of opening according to various disclosed embodiments of the present disclosure.

FIG. 6 is a schematic top view of the first type of opening 511. As shown in FIG. 6, the second holding area 511B may include a first sub-area 5111 and a second sub-area 5112. The area of the first sub-area 5111 may be greater than the area of the second sub-region 5112, and the second sub-region 5112 may be connected with the first sub-region 5111 and the first holding area 511A.

In one embodiment, the first sub-area 5111, the first holding area 511A, and the second sub-area 5112 may form a combined opening. Such a configuration may not only avoid the presence of an obvious light-shielding frame between the first sub-area 5111 and the first holding area 511A to reduce the light diffraction caused by the frame and improve the working performance of the preset functional element, but also avoid that the edge of one side of the first sub-area 5111 is all limited by the first color resist. Accordingly, the issue when the preset functional element is an imaging element, such as a camera, the corresponding image is not clear at the edge of the first sub-region 5111 may be avoided.

Figure 7:
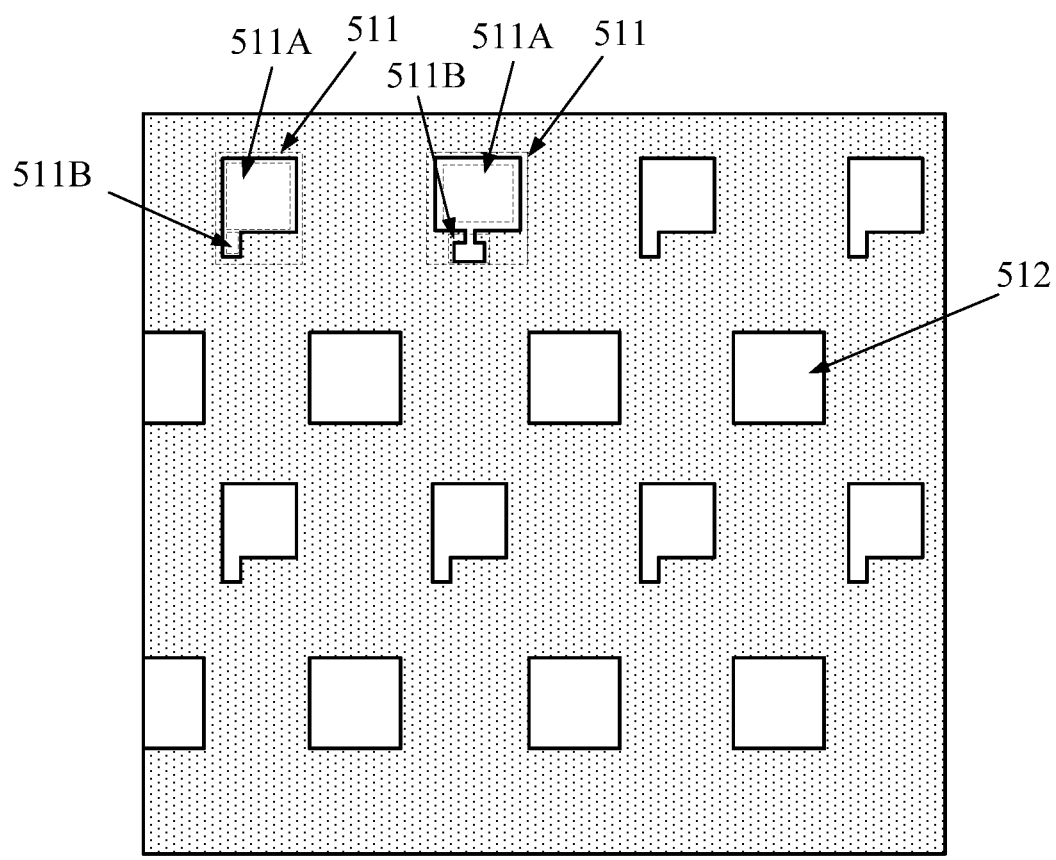
FIG. 7 illustrates a top view of another exemplary display panel according to various disclosed embodiments of the present disclosure.

FIG. 7 is a schematic top view of an exemplary display panel consistent with various disclosed embodiments of the present disclosure. As shown in FIG. 7, there may be at least two first-type openings 511 in which the second holding areas 511B may have different shapes.

The different shapes of the second holding areas 511B of the first type of openings 511 may adapt to the light requirements of different positions of the preset functional elements, and meet the working requirements of the preset functional element.

Figure 8:
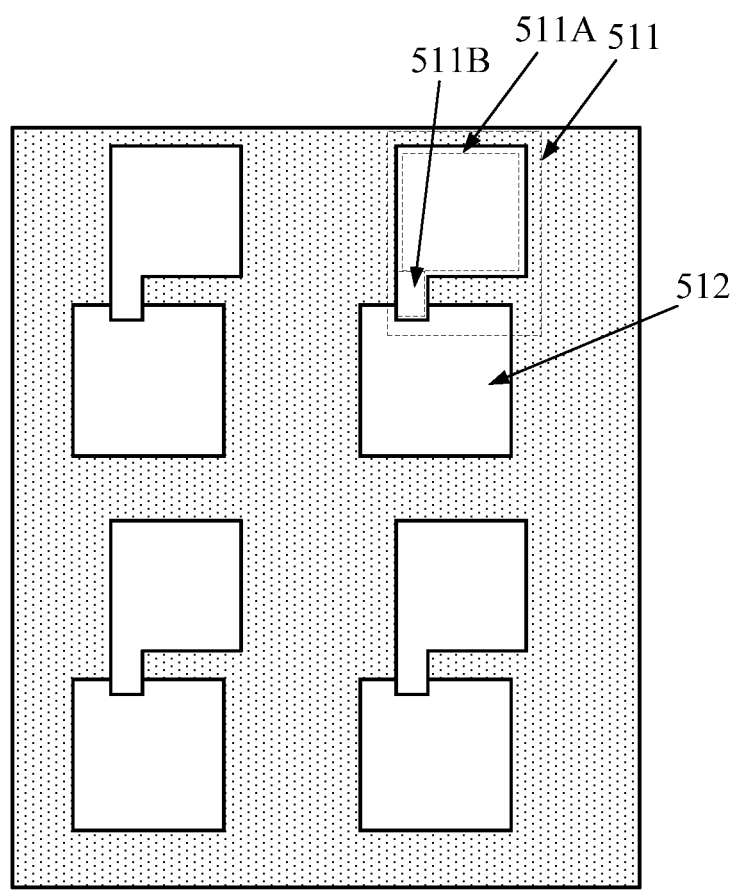
FIG. 8 illustrates a top view of another exemplary display panel according to various disclosed embodiments of the present disclosure.

FIG. 8 is a schematic top view of the exemplary display panel of FIG. 7. As shown in FIG. 8, in one embodiment, the orthographic projection of the second holding area 511B on the substrate and the orthographic projection of the second type of opening 512 adjacent to the second holding area 511B on the substrate may at least partially overlap.

In one embodiment, when the arrangement of the light-shielding layer openings is too dense due to the dense arrangement of the light-emitting units, there may be a problem that the space between adjacent openings is too small. Such an arrangement of the partial overlap between the second holding area 511B and the adjacent second type of opening 512 may meet the working requirements of the preset functional element.

In one embodiment of the present disclosure, the opening area of the second type of opening and the opening area of the first type of opening and the opening area of the first type of opening may satisfy a first preset formula.

The first preset formula may include: $0.9 \leq S20/S11+S12 \leq 1$. S20 represents the opening area of the second type of opening, S11 represents the opening area of the first holding area 511A, and S12 represents the opening area of the second holding area 511B.

In one embodiment, the ratio of the opening area of the second type of opening 512 to the area of the first type of opening 511 may be limited to between 0.9 and 1. On the one hand, the difference in the opening areas of the first type of opening and the second type of opening may be reduced to reduce the visual problem of the second holding area 511B under the sunlight of the display panel. On the other hand, it may avoid the low light-exiting efficiency issue caused by the excessing blocking of the too small first type of opening 511.

Figure 9:
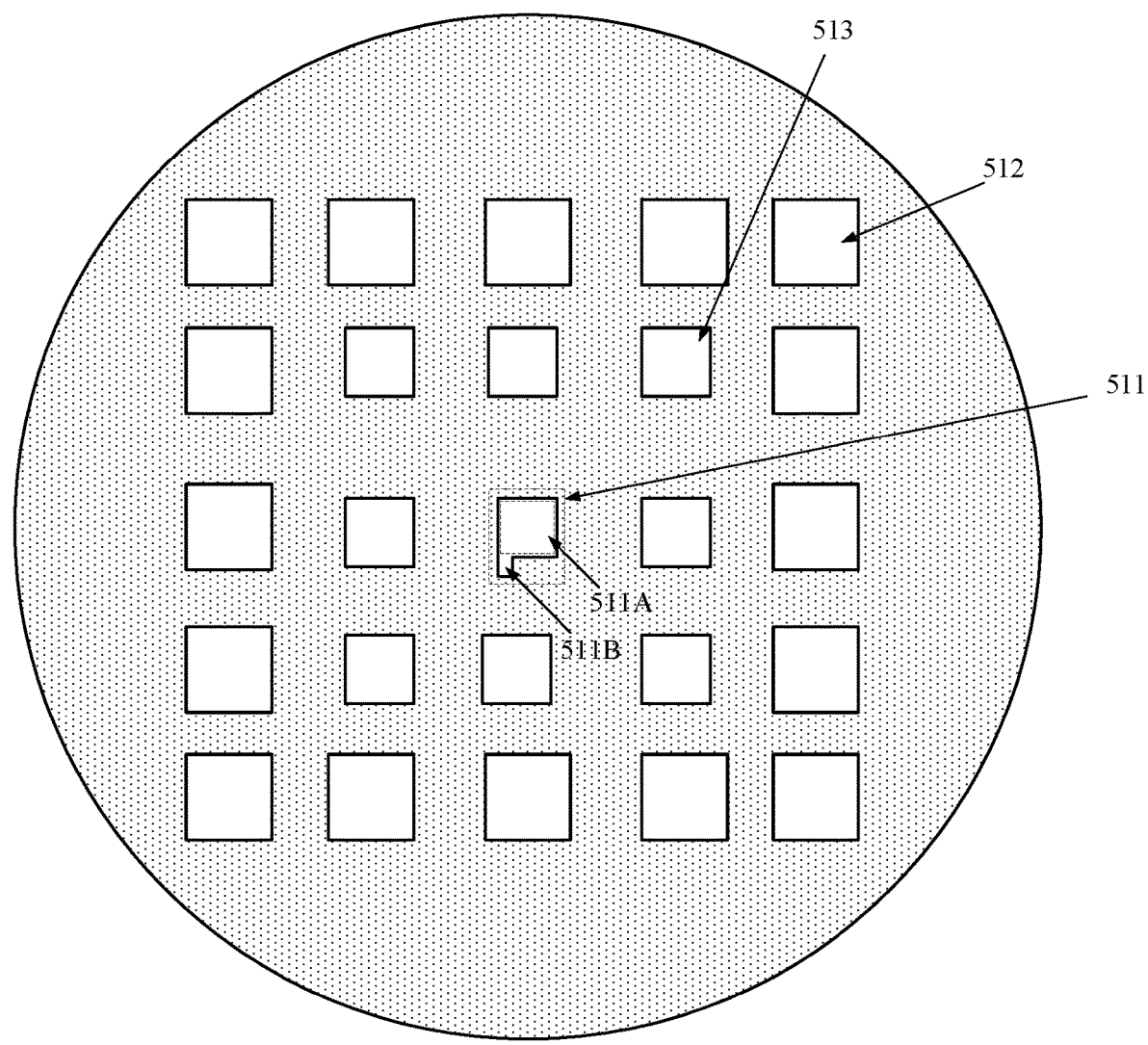
FIG. 9 illustrates a partial top view of an exemplary display panel according to various disclosed embodiments of the present disclosure.

FIG. 9 is a schematic top view of an exemplary display panel consistent with various disclosed embodiments of the present disclosure. As shown in FIG. 9, the black matrix of the display panel may further include at least one third type of opening 513 adjacent to the first type of opening 511.

The third type of opening 513 may be used to dispose the first color resist. The color of the first color resist disposed in the third type of opening 513 may be same as the color of the first color resist disposed in the first type of opening 511.

The opening area of the third type of opening 513 may be smaller than the opening area of the second type of opening 512. The opening area of the third type of opening 513 may be larger than the area of the first holding area 511A.

In FIG. 9, the third type of openings 513 may be adjacent to the first type of opening 511, and may be used to fill the opening of color resists of a same color. Disposing the third type of openings 513 around the first type of opening 511 may alleviate the problem of abrupt changes in light output characteristics caused by the large difference between the opening area of the first holding area 511A of the first type of opening 511 and the opening area of the second type of opening 512.

In one embodiment, regarding the relationship between the areas of the third type of opening 513, the first type of opening 511, and the second type of opening 512, the opening areas of the third type of opening 513, the first type of openings 511, and the second type of opening 512 may satisfy the second preset formula: $n \times S30+S11+S12 \leq (n+1) \times S20$. S30 represents and the opening area of the third type of opening, S20 represents the opening area of the second type of opening 512, S11 represents the opening area of the first holding area 511A, and S12 represents the opening area of the second receiving area 511B, and n represents the number of the third type of openings 513 adjacent to the first type of opening 511.

In one embodiment, the opening area of the second holding area 511B may be "allocated" to the first holding area 511B and the adjacent third type openings 513. For example, assuming that the opening area of the second holding area 511B is 10 $\mu m^2$, the opening area of the second type of opening 512 is 50 µm², and the number of the third type of openings 513 adjacent to the first type of opening 511 is 9, then the opening area of the first type of opening 511 may be reduced to 49 µm², and the opening area of the third type of openings 513 may be reduced to 49 µm². Such a configuration may allocate the increased opening area of the second holding area 511B to one first type opening 511 and nine third type openings 513 to allow the total opening area of the first type of opening 511 and the 9 third type of openings 513 to be equal to the total opening area of the surrounding 10 second type of openings 512. Accordingly, on the basis of solving the problem of reflectively visible of the second holding area 511B under sunlight, the problem of the abrupt change in the light-emission characteristic caused by the large difference between the opening area of the first holding area 511A of the first type of opening 511 and the opening area of the second type of opening 512 may be reduced.

In one embodiment, the difference between the opening area of the third type of opening 513 and the opening area of the second type of openings may be equal to one n-th (1/n) of the opening area of the second holding 521B.

For example, in one embodiment, the opening areas of the third type of openings 513, the first type of openings 511, and the second type of openings 512 may satisfy n×S30+S11+S12=(n+1)×S20. Such an opening area relationship may significantly reduce issue of the reflective visible of the second holding area 511B under sunlight, and at the same time, the problem of the abrupt change in the light-emission characteristic caused by the large difference between the opening area of the first holding area 511A of the first type of opening 511 and the opening area of the second type of opening 512 may be reduced.

In one embodiment, the opening area of the first holding area 511 may be equal to the opening area of the third type of opening 513.

In one embodiment, the opening area of the first holding area 511A may be equal to the opening area of the third type of opening 513. Further, the opening areas of, and the third type of openings 513, the first type of opening 511 and the second type of opening 512 may satisfy n×S30+S11+S12=(n+1)×S20. For example, the opening area of the second holding area 511B may be allocated evenly to the first holding area 511A and the adjacent third type of openings 513. Such a configuration may facilitate to simplify the preparation process of the first type of opening 511 and the third type of openings 513, and may be not necessary to provide different mask openings for the third type openings 513 or the first type opening 511 with different opening areas.

Figure 10:
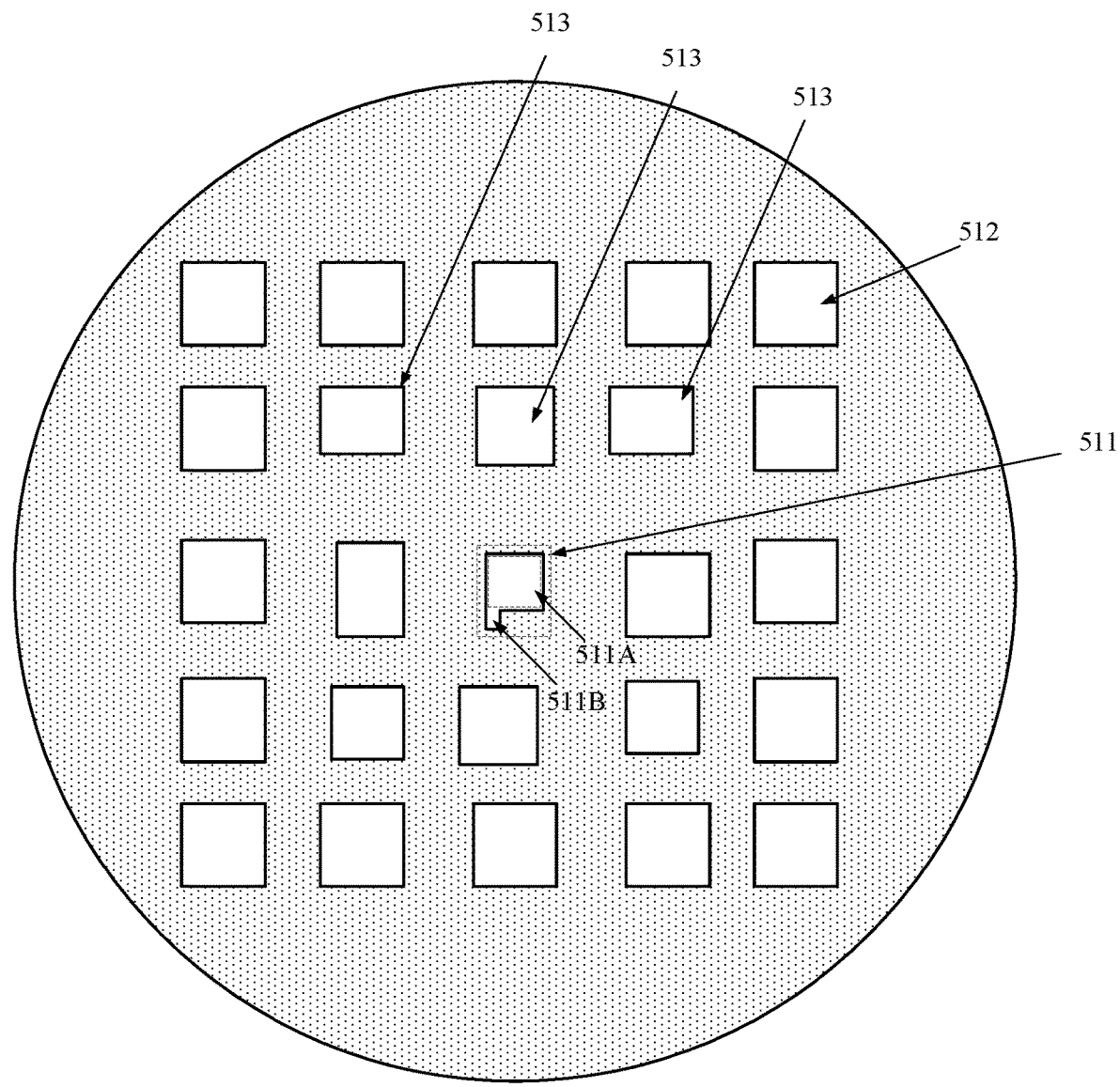
FIG. 10 illustrates another partial top view of an exemplary display panel according to various disclosed embodiments of the present disclosure.

FIG. 10 is a partial top view of an exemplary display panel consistent with various disclosed embodiments of the present disclosure. When the opening areas of the third type openings 513 are equal, there may be at least two third type of openings 513 having different length-to-width ratios.

Because the first color resists of the same color in the display panel may be periodically arranged, for example, the first color resists corresponding to the light-emitting units in the display panel may form a matrix, and the first color resists of the same color may form a two-dimensional grating surface. After the external light enters in the display panel, the light emitted from the first color resists of the same color after being reflected by the anode of the light-emitting unit, or the light directly reflected by the first color resists of the same color may cause a grating diffraction phenomenon, and obvious color stripes may appear on the display panel when the display panel does not emit light, or the brightness is low. Accordingly, the user experience may be adversely affected.

In one embodiment, the third type of openings 513 for holding the first color resists of the same color may be differentiated in at least one dimension, and at least one matrix formed by first color resists may be changed accordingly. Accordingly, the two-dimensional grating surface composed of the first color resists of the same color may be destroyed, and the regularity of grating diffraction may be obviously broken. Thus, the grating diffraction phenomena occurring between the light emitted by the first color resists after being reflected by the anode of the light-emitting unit and the light directly reflected by the first color resists may be effectively alleviated.

Figure 11:
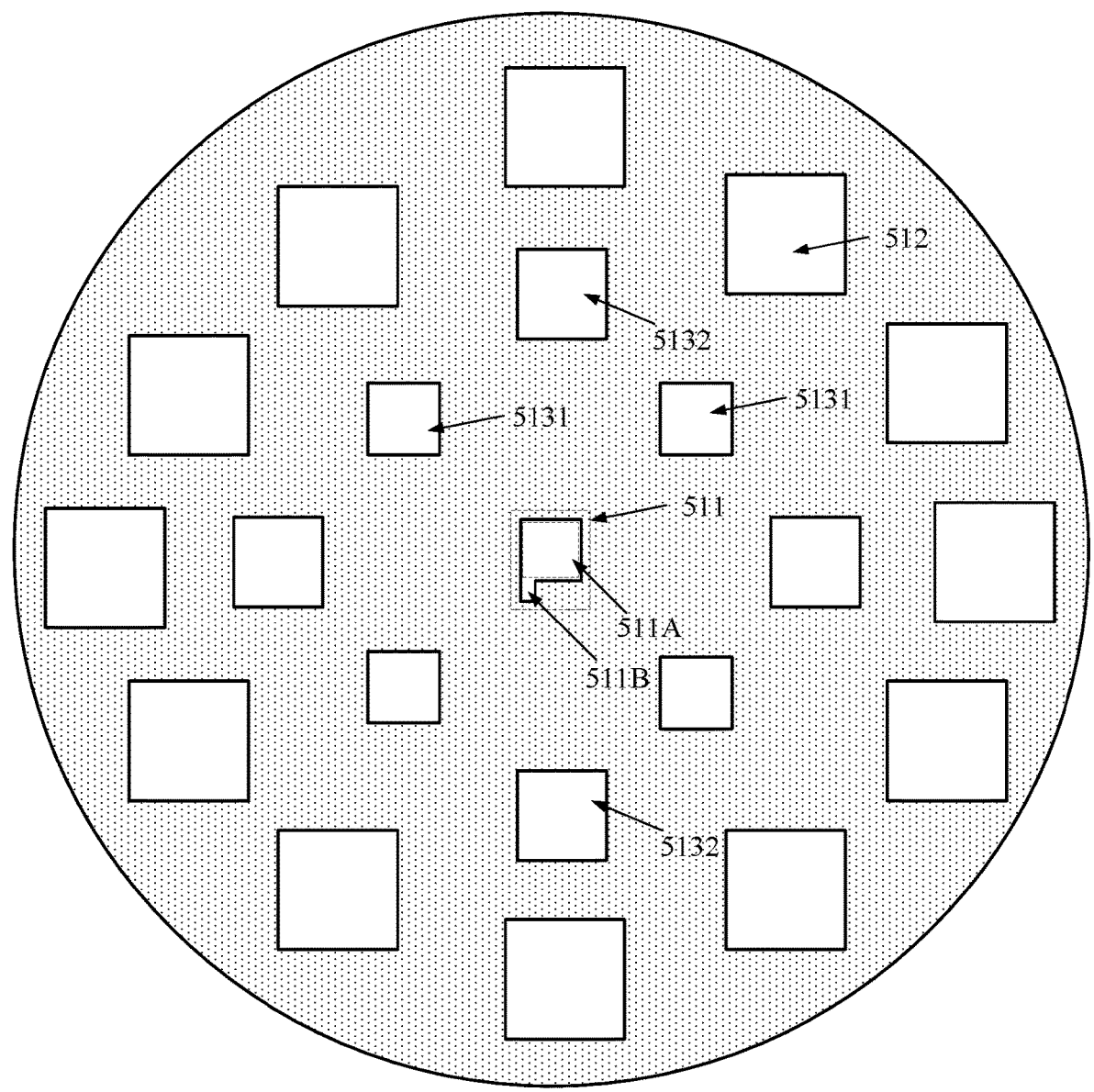
FIG. 11 illustrates another partial top view of an exemplary display panel according to various disclosed embodiments of the present disclosure.

FIG. 11 is a schematic partial top view of another exemplary display panel consistent with various disclosed embodiments of the present disclosure. As shown in FIG. 11, the third type of openings 513 may include M types of sub-openings. M may be greater than or equal to 2.

The same type of sub-openings may be arranged around one of the first type of openings. The distances between the same type of sub-openings and the surrounded first type of openings 511 may be equal.

The opening area of the sub-opening may be positively correlated with the distance between the sub-opening and the surrounded first type of opening 511.

In FIG. 11, two types of sub-openings are shown, namely 5131 and 5132. The distance between the sub-opening 5131 and the first type of opening 511 may be relatively short, and the opening area of the sub-opening 5131 may be smaller than the opening area of the sub-opening 5132. These types of sub-openings may be arranged around the first type of opening 511, and the area of the openings may increase as the distance increases. A transition zone of opening areas may be formed between the first type of opening 511 and the second type of openings 512. Such a configuration may reduce the issue of the abrupt change in the light emission characteristic caused by the large difference between the opening area of the first holding area 511A of the first type of opening 511 and the second type of opening 512.

Figure 12:
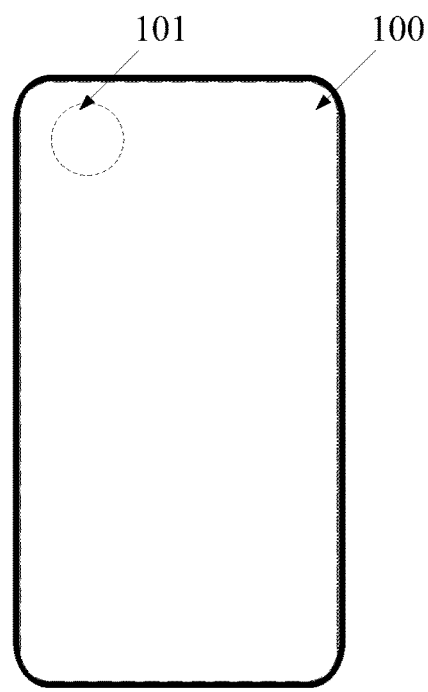
FIG. 12 illustrates an exemplary display device according to various disclosed embodiments of the present disclosure.

The present disclosure also provides a display device. FIG. 12 illustrates an exemplary display device consistent with various disclosed embodiments of the present disclosure. As shown in FIG. 12, the display device 100 may include a preset functional element and one of present disclosed display panels.

The preset functional component may include, but are not limited to, a camera, a photosensitive component, a fingerprint recognition module, and/or a structured light-emitting modules, etc. The area where the dashed frame 101 in FIG. 12 is located may be feasible for disposing the preset functional element.

Figure 13:
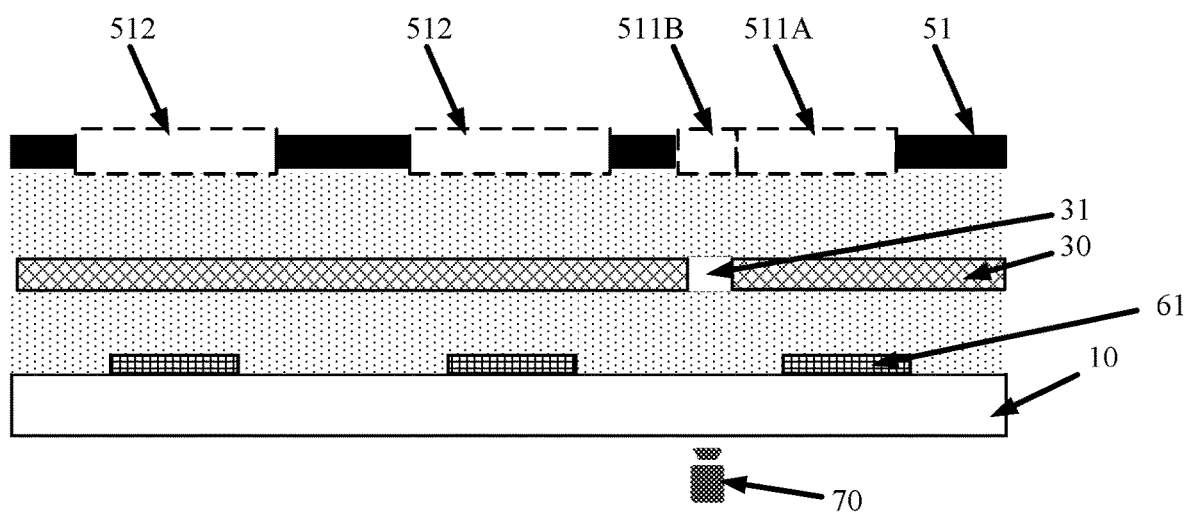
FIG. 13 illustrates a cross-sectional of an exemplary display device according to various disclosed embodiments of present disclosure.

FIG. 13 is a schematic cross-sectional structure diagram of the display device 100. As shown in FIG. 13, the preset functional element 70 may be disposed on the side of the signal line layer 30 of the display panel away from the light-shielding layer 51 of the display panel.

The signal line layer 30 may include a signal line opening 31. The orthographic projection of the signal line opening 31 on the substrate 10 of the display panel and the orthographic projection of the light-emitting unit 61 of the display panel on the substrate 10 may not overlap with each other.

The second holding area 511B of the display panel may cooperate with the signal line opening 31 corresponding to the second holding area 511B to form a light path.

It should be noted that, for the clarity of the illustration, only one second holding area 511B and one signal line opening 31 are shown in FIG. 13, and the second holding area 511B and the signal line opening 31 may be in a one-to-one correspondence.

In the actual application process, the number of the second holding area 511B and the signal line opening 31 on the entire display panel may be generally greater than one.

Further, FIG. 13 shows the setting method of the plug-in preset function element 70. In some embodiments of the present disclosure, the preset functional element 70 may also be integrated into the interior of the display panel. For example, the preset functional element 70 may be between the substrate and the signal line layer. The present disclosure does not limit the specific setting method of the preset functional element 70, which depends on the actual situation.

In summary, the present disclosure provides a display panel and a display device. The display panel may include a light-shielding layer on the side of the light-emitting unit away from the substrate, and the openings in the light-shielding layer may be referred to as the first type of openings and the second type of openings. The second holding area in the first type of opening may be used to dispose a filling color resist as a portion of the light path constituting the preset functional element. The second type of opening and the first holding area in the first type of opening may all be used to dispose a first color resist to exist as a light path for normal display light. The opening area of the first holding area may be smaller than the opening area of the second type of opening to reduce the difference between the opening area of the first type of opening and the second type of opening. Accordingly, the visibility of the second holding area under the operation conditions, such as a sunlight exposure of the display panel, may be reduced, and the user experience may be improved.

The features recorded in the embodiments in this specification can be replaced or combined with each other. Each embodiment focuses on the differences from other embodiments, and the same or similar parts between the various embodiments can be referred to each other.

The foregoing description of the disclosed embodiments enables those skilled in the art to implement or use this disclosure. Various modifications to these embodiments will be obvious to those skilled in the art, and the general principles defined herein can be implemented in other embodiments without departing from the spirit or scope of the disclosure. Therefore, this disclosure will not be limited to the embodiments shown in this document, but should conform to the widest scope consistent with the principles and novel features disclosed in this disclosure.

What is claimed is:

1. A display panel, comprising:
a substrate;
a light-emitting unit disposed on one side of the substrate, the light-emitting unit including a pixel electrode; and
a light-shielding layer disposed on a side of the pixel electrode away from the substrate,
wherein:
the light-shielding layer includes a first type of openings and a second type of openings;
each of the first type of openings includes a first holding area and a corresponding second holding area connected with the first holding area, wherein the first holding area and the second holding area have a rectangular shape and are located in a same layer and do not overlap each other, a width of the first holding area is larger than a width of the second holding area, a length of the first holding area is larger than a length of the second holding area, and each edge of the first holding area and the second holding area is directly adjacent to a black matrix in the light-shielding layer;
first holding areas and the second type of openings are configured to dispose first color resists;
the second holding area is configured to dispose a filling color resist, wherein at least one of the first type of openings has different colors between a color of an only type of filling color resist disposed within a first holding area and a color of an only type of first color resist disposed within a second holding area associated with the first holding area of a same first type of opening; and
an opening area of the first holding area is smaller than an opening area of each of the second type of openings.

2. The display panel according to claim 1, wherein:
the filling color resists are all of a same color.

3. The display panel according to claim 2, wherein:
the filling color resists have a same color as at least one of the first color resists in the first holding areas.

4. The display panel according to claim 2, wherein:
the filling color resists include green color resists.

5. The display panel according to claim 1, wherein:
a shape of an orthographic projection of the first holding area on the substrate, a shape of an orthographic projection of the second holding area on the substrate and a shape of an orthographic projection of the second type of opening on the substrate all include a rectangle.

6. The display panel according to claim 5, wherein:
an orthographic projection of the light-emitting unit on the substrate is located within the second type of opening corresponding to the light-emitting unit or located within the first holding area corresponding to the light-emitting unit; and
a first projection distance is greater than a second projection distance, wherein the first projection distance includes a distance between a side of the orthographic projection of the light-emitting unit on the substrate and a side of the orthographic projection of the second type of opening corresponding to the light-emitting unit, and the second projection distance includes a distance between a side of the orthographic projection of the light-emitting unit on the substrate and a side of the orthographic projection of the first holding area corresponding to the light-emitting unit.

7. The display panel according to claim 6, wherein:
a difference between the first projection distance and the second projection distance is smaller than, or equal to 1 μm.

8. The display panel according to claim 1, wherein:
a difference between the opening area of the first holding area and the opening area of the second type of opening is smaller than, or equal to the opening area of the second type of opening.

9. The display panel according to claim 1, wherein:
the second holding area includes a first sub-area and a second sub-area;
an area of the first sub-area is greater than an area of the second sub-area; and
the second sub-area forms a neck structure between the first sub-area and the first holding area.

10. The display panel according to claim 1, wherein:
at least two second holding areas of the first type of openings include different shapes.

11. The display panel according to claim 1, wherein:
an opening area of the second type of opening and an opening area of the first type of opening satisfy a first preset formula; and
the first preset formula includes: $0.9 \leq S20/S11+S12 \leq 1$, wherein:
S20 represents the opening area of the second type of opening;
S11 represents the opening area of the first holding area; and
S12 represents an opening area of the second holding area.

12. The display panel according to claim 1, wherein the black matrix comprises:
at least one third type of opening adjacent to the first type of opening,
wherein:
the third type of opening is configured to dispose a first color resist;
the first color resist disposed in the third type of opening has a same color as for the first color resist disposed in the first type of the opening;
an opening area of the third type of opening is smaller than the opening area of the second type of opening; and
the opening area of the third type of opening is greater than the opening area of the first holding area.

13. The display panel according to claim 12, wherein:
the opening area of the third type of opening, the opening area of the second type of opening and the opening area of the first type of opening satisfy a second preset formula; and
the second preset formula includes: $n \times S30+S11+S12 \leq (n+1) \times S20$
wherein:
S30 represents the opening area of the third type of opening,
S20 represents the opening area of the second type of opening;
S11 represents an opening area of the first holding area;
S12 represents the opening area of the second holding area; and
n represents a number of the third type of openings adjacent to the first type of opening.

14. The display panel according to claim 13, wherein:
a difference between the opening area of the third type of opening and the opening area of the second type of opening is one n-th (1/n) of the opening area of the second holding area.

15. The display panel according to claim 14, wherein:
the opening area of the first type of holding area is equal to the opening area of the third type of holding area.

16. The display panel according to claim 12, wherein:
each opening of the third type of openings has a same opening area; and
at least two third type of openings have different length-to-width ratios.

17. The display panel according to claim 12, wherein:
the third type of openings include M types of sub-openings, M being greater than or equal to 2;
a same type of sub-openings of the M-types of sub-opening are arranged around a first type of opening;
distances between the same type of sub-openings and the first type of opening surrounded by the same type of sub-openings are equal; and
an opening area of a sub-opening is positively correlated to a distance between the sub-opening and a first type of opening surrounded by the sub-opening.

18. A display device, comprising the display panel of claim 1.

19. A display panel, comprising:
a substrate;
a light-emitting unit disposed on one side of the substrate, the light-emitting unit including a pixel electrode; and
a light-shielding layer disposed on a side of the pixel electrode away from the substrate,
wherein:
the light-shielding layer includes a first type of openings and a second type of openings;
each of the first type of openings includes a first holding area and a corresponding second holding area connected with the first holding area, wherein the first holding area and the second holding area have a rectangular shape and are located in a same layer and do not overlap each other;
the second holding area further includes a first sub-area and a second sub-area, an area of the first sub-area is greater than an area of the second sub-area, along a first direction, a width of the first holding area is greater than a width of each of the first sub-area and the second sub-area, the second sub-area is connected with the first holding area through the first sub-area, and each edge of the first holding area, the first sub-area and the second sub-area is directly adjacent to a black matrix in the light-shielding layer;
first holding areas and the second type of openings are configured to dispose first color resists;
the second holding area is configured to dispose a filling color resist, wherein at least one of the first type of openings has different colors between a color of an only type of filling color resist disposed within a first holding area and a color of an only type of first color resist disposed within a second holding area associated with the first holding area of a same first type of opening; and
an opening area of the first holding area is smaller than an opening area of each of the second type of openings.

20. A display panel, comprising:
a substrate;
a light-emitting unit disposed on one side of the substrate, the light-emitting unit including a pixel electrode; and
a light-shielding layer disposed on a side of the pixel electrode away from the substrate,
wherein:
the light-shielding layer includes a first type of openings and a second type of openings;
each of the first type of openings includes a first holding area and a corresponding second holding area connected with the first holding area, wherein the first holding area and the second holding area have a rectangular shape and are located in a same layer and do not overlap each other, and the first holding area is connected to one of the second type of openings through the second holding area, wherein each edge of the first holding area, second holding area and the second type of openings is directly adjacent to a black matrix in the light-shielding layer;
first holding areas and the second type of openings are configured to dispose first color resists;
the second holding area is configured to dispose a filling color resist, wherein at least one of the first type of openings has different colors between a color of an only type of filling color resist disposed within a first holding area and a color of an only type of first color resist disposed within a second holding area associated with the first holding area of a same first type of opening;
an opening area of the first holding area is smaller than an opening area of each of the second type of openings; and
an orthographic projection of the second holding area on the substrate and an orthographic projection of the second type of opening adjacent to the second holding area on the substrate at least partially overlap with each other.

\* \* \* \* \*